United States Patent [19]

Satoh

[11] Patent Number: 4,970,352
[45] Date of Patent: Nov. 13, 1990

[54] MULTIPLE CORE COAXIAL CABLE

[75] Inventor: Kazuhiro Satoh, Tochigi, Japan

[73] Assignee: Sumitomo Electric Industries, Ltd., Osaka, Japan

[21] Appl. No.: 333,415

[22] Filed: Mar. 14, 1989

[30] Foreign Application Priority Data

Mar. 14, 1988 [JP] Japan .................................. 63-58514

[51] Int. Cl.⁵ ............................................. H01B 7/34
[52] U.S. Cl. .............................. 174/106 R; 174/102 C; 174/103; 174/108
[58] Field of Search .................... 174/106 R, 103, 108, 174/102 G

[56] References Cited

U.S. PATENT DOCUMENTS

| | | | |
|---|---|---|---|
| 1,922,726 | 8/1933 | Del Mar | 174/106 R |
| 2,019,297 | 10/1935 | Faucett | 174/103 |
| 4,358,636 | 11/1982 | Ijff et al. | 174/103 |
| 4,847,448 | 7/1989 | Sato | 174/108 X |

FOREIGN PATENT DOCUMENTS

| | | | |
|---|---|---|---|
| 216883 | 5/1958 | Australia | 174/106 R |
| 2601608 | 7/1977 | Fed. Rep. of Germany | 174/106 R |
| 1267659 | 12/1961 | France | 174/108 |
| 570380 | 7/1945 | United Kingdom | 174/106 SC |

*Primary Examiner*—Morris H. Nimmo
*Attorney, Agent, or Firm*—Cushman, Darby & Cushman

[57] ABSTRACT

A multicore coaxial cable includes a conductor layer, an insulator layer surrounding the conductor layer, plastic tape surrounding the insulator and a metal shield surrounding the plastic tape. The exterior surface of the plastic tape is coated with a metal layer to contact the metal shield to reduce the electrostatic noises in the cable.

7 Claims, 3 Drawing Sheets

MULTIPLE CORE COAXIAL CABLE

BACKGROUND OF THE INVENTION

1. Field of the Invention

The present invention generally relates to coaxial wires or cords, and particularly relates to improvements in coaxial wires or cords in which electrostatic noises can be effectively prevented without increasing the outer diameter of the coaxial wires or cords.

2. Description of the Prior Art

Flexible coaxial wires or cords are desirable for wiring inside or between electronic equipment. When flexible coaxial wire or cord moves, however, fine structural gaps may form between adjacent coaxial core layers. These adjacent layers may include, for example, an insulator layer and an external shielding layer or a sheath layer and the external shielding layer. Although it is important for a coaxial wire or cord to be flexible, the flexibility inherently gives rise to static electricity buildup when the gapped layers rub against each other.

Although static electricity is inherently generated by the rubbing movement of the core layers and affects the critical transmission of signals along the central electric conductor, to date the influence of static electricity has been largely ignored.

Attempts to remedy the static electricity problem have been hindered by the resultant increase in wire size associated with eliminating the static electricity. Wiring materials inside or between electronic equipment in, for example, medical equipment, measuring equipment, or the like, require multi-core cables using extra fine coaxial wires or cords. The coaxial wires or cords used in these precise instruments have compromised performance for the sake of flexibility and thinness.

SUMMARY OF THE INVENTION

It is an object of the present invention to provide a reduced diameter flexible core cable that is less susceptible to static electricity buildup than known cables and that is substantially unaffected by external noises.

In order to attain the above objects, the present invention provides a coaxial shielded cable comprising:
an electrical conductor;
an insulator enclosing the conductor;
a plastic tape having one surface coated with a metal layer, the plastic tape being wound around the insulator so as to compress the insulator; and
a metal shield provided to cover the outer circumference of the plastic tape so that the metal layer of the plastic tape comes into contact with the metal shield.

According to another aspect of the present invention, the multi-core cable comprises:
a collectively provided plurality of coaxial shielded wires or cords;
a sheath covering the outside of the collectively provided plurality of coaxial shielded cords;
each of the coaxial wires or cords including an electrical conductor;
an insulator enclosing the conductor, a plastic tape having one surface with a metal layer and being wound around the insulator so as to compress the insulator; and
a metal shield provided to cover the outer circumference of the plastic tape so that the metal layer of the plastic tape comes into contact with the metal shield.

Preferably, in the coaxial shielded wire or cord, the one surface of the plastic tape is coated with the metal layer formed of a good electrically conductive material such as copper, tin, or the like, by coating means such as evaporation, sputtering, or the like, to a thickness not less than 0.2 $\mu$m.

In accordance with these and other objects which will become apparent, the present invention will be described with particular reference to the accompanying drawings.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENT

Figure 1:
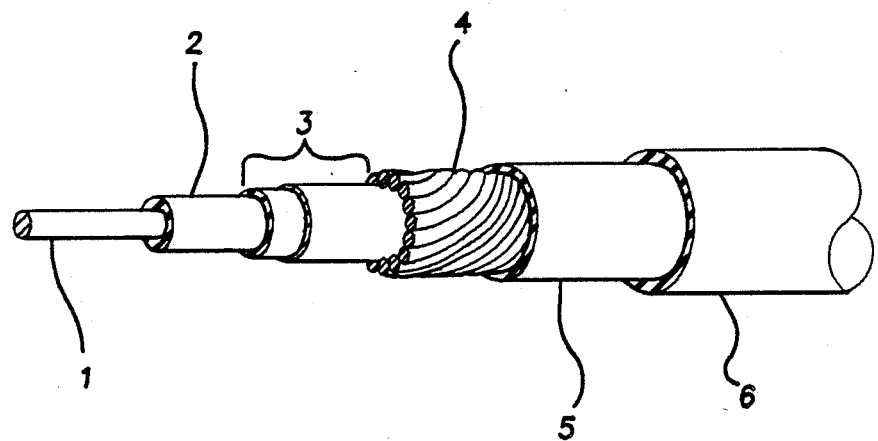
FIG. 1 is a partially cut-away schematic perspective view showing the structure of the coaxial shielded wire or cord according to the present invention.

FIG. 1 is a partially cut-away schematic perspective view showing the structure of the coaxial shielded wire or cord according to the present invention.

An electric conductor 1 can be a single wire or twisted wires of copper, aluminum, an alloy of copper, an alloy of aluminum, copper plated with tin or silver, aluminum plated with tin or silver, or the like. An insulator 2 such as a plastic tape or the like is wound around the electric conductor. A metal-coated plastic layer 3 is then provided around the insulator 2. The metal-coated plastic layer 3 has one side surface coated with a metal layer of copper or tin deposited by a coating means such as evaporation, sputtering, or the like.

An adhesive layer for heat-sealing is provided on an opposite surface of the side surface coated with the metal layer, so that the metal coated plastic layer 3 is wound around the insulator 2 and integrated through heat treatment. A metal shield 4, such as spiral covered shield or braid shield of metal wires or tapes of electrically conductive or ferromagnetic material, are spirally wound around the metal-coated plastic layer 3 so that the metal layer of the plastic layer 3 is in contact with the metal shield 4. Sheaths 5 and 6, each formed of an insulating plastic tape of PTFE or the like, are then provided around the cable as protective coverings.

The insulator 2 and the plastic portion of the metal-coated plastic layer 3, and the respective plastic tapes of the sheaths 5 and 6 may be integrated with each other through thermal fusing.

The sheaths 5 and 6 and the like of the coaxial shielded wire or cord, according to the present invention, can be easily separated from the coaxial shield wire or cord by using an ordinary jig.

It is preferable that the metal-coated plastic tape suitable for use in the coaxial shielded line, according to the present invention, is constructed in such a manner that a homogenous thin metal layer is formed on a plastic tape. Accordingly, generally, the metal layer may be applied onto the plastic tape in the form of a thin layer of 0.2 μm thick or more by an evaporation or sputtering method.

Figure 4:
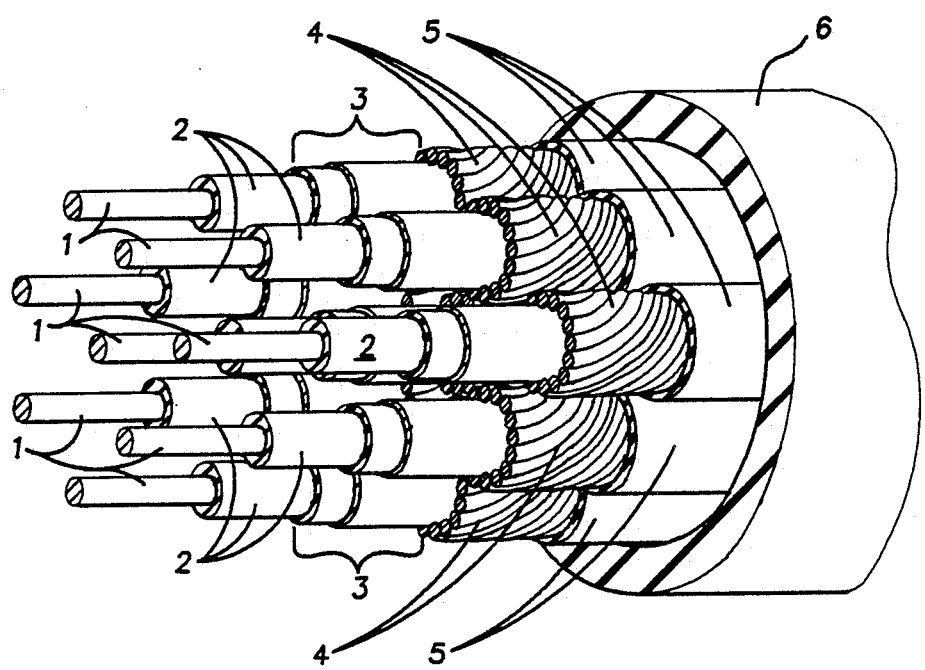
FIG. 4 is a partially cut-away view of a multi-core conductor coaxial cable according to the present invention.

Although the coaxial shielded wire or cord according to the present invention can be solely used, the present invention may be applied also to a multi-core cable formed in such a manner that a plurality of coaxial shielded wires or cords according to the present invention are collected and a plastic sheath 6 is formed to enclose the outside of the collective coaxial shielded wires or cords as shown in FIG. 4. In FIG. 4, like numbers correspond to like elements shown in FIG. 1.

The coaxial shielded wire or cord has the following features resulting from the metal-coated plastic tape being wound around the insulator so the metal surface of the plastic tape is in contact with the metal shield such as a spiral covered shield or the like:

1. Unlike the conventional coaxial shielded wire or cord, using no metal-coated plastic tape, the coaxial shielded wire or cord according to the present invention has an advantage in that electrostatic noises which may affect a signal level can be essentially eliminated.

2. If the insulating layer is exposed over a somewhat large length in terminal working or the like in the conventional coaxial shielded wire or cord, the exposed portion of the coaxial shielded wire or cord becomes as if it is a mere insulated wire to create a problem of crosstalk or the like. In the coaxial shielded wire or cord, according to the present invention, the exposed portion is maintained at zero potential, since the metal surface of the metal-coated plastic tape at the exposed portion is directly in contact with the metal shield, such as a spiral covered shield or the like, so that the coaxial shielded wire or cord is substantially unaffected by external noises.

(EXAMPLE)

Figure 3:
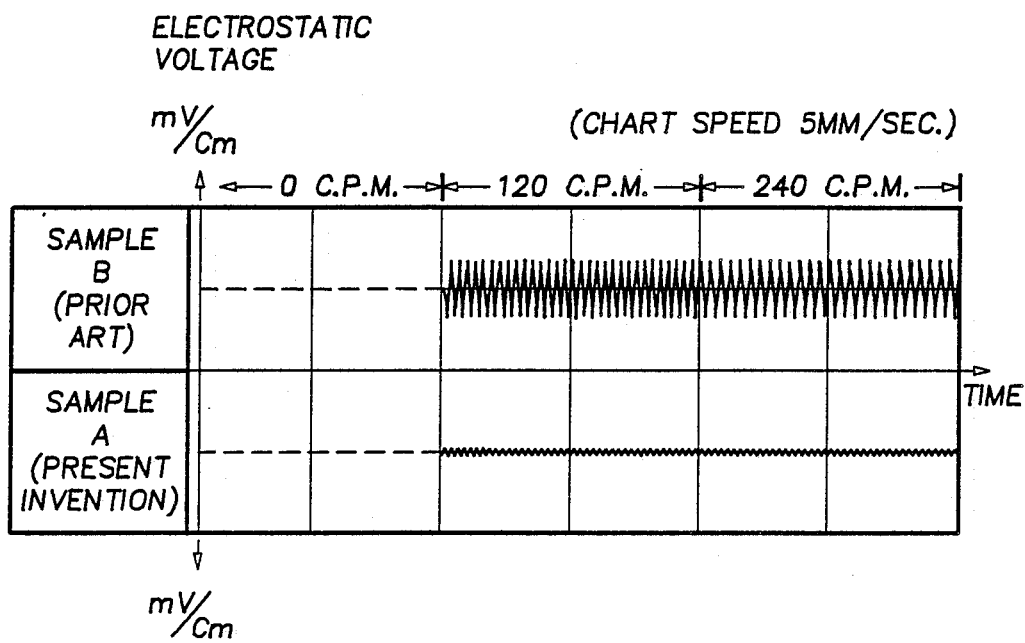
FIG. 3 is a view is showing the results of measurement results of the electrostatic potential generated in the coaxial shielded wire or cord.

Referring to FIG. 3, an electrostatic noise characteristic comparison test was performed with respect to the coaxial shielded wire or cord (Sample A) according to the present invention and the conventional coaxial wire or cord (Sample B) under the following conditions, and the following experimental results were obtained.

(1) STRUCTURE OF SAMPLES

Sample A

1. Central conductor: seven wires each 0.05 mm φ of a tin-plated copper alloy (Tradename: AWG 36) were twisted together.
2. Insulator: foam Teflon tape of 2.0 mm thick was wound around the central electric conductor.
3. Compressing winding: a metal-evaporated tape formed of a polyester tape of 2 mm wide with its one surface provided with a copper layer of 0.8-1.0 μm thick deposited thereon through evaporation was wound around the insulator 2 and integrated through heat treatment.
4. Shield: thirty tin-plated copper soft wires each 0.05 mm φ are spirally wound around the metal-evaporated tape 3 at a pitch of 8.5 mm.
5. Primary and secondary sheaths: each formed of Teflon tape of 3 mm wide.

Sample B

The Sample B had the same structure as that of the coaxial shielded wire or cord according to the present invention (the Sample A) except that the metal-evaporated plastic tape 3 was omitted.

The structure of the respective Samples A and B are to be summarized in the following Table.

TABLE

| Sample | Conductor | Insulator | Pressure winding | Shield | Sheath (Core-sheath) |
|---|---|---|---|---|---|
| A | Tin-plated copper-alloy wire | Foam Teflon tape | Metal-evaporated plastic tape | Tin-plated copper wire spiral wound shield | Teflon tape |
| B | Tin-plated copper-alloy wire | Foam Teflon tape | Non | Tin-plated copper wire spiral wound shield | Teflon tape |

(2) CONDITIONS OF EXPERIMENT

Figure 2:
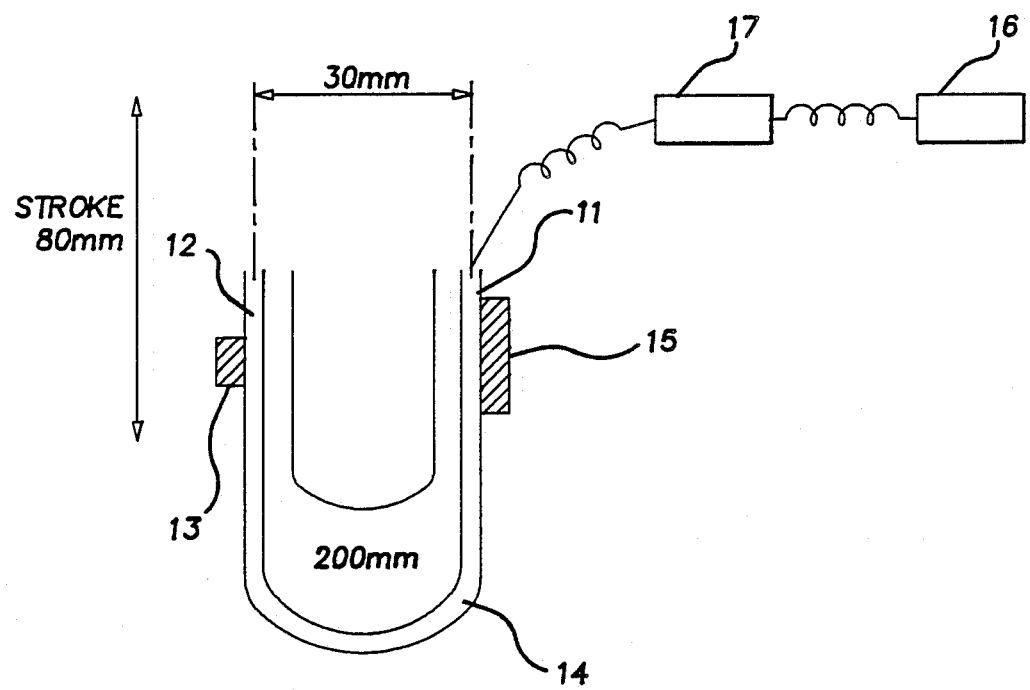
FIG. 2 is a schematic view for explaining the state of measurement of an electrostatic potential generated in the coaxial shielded wire or cord.

As shown in FIG. 2, a sample 14 of a piece of coaxial shielded wire or cord of about 200 mm length is hung down in the form of a U-shape while being fixed at its one and the other ends 11 and 12 respectively on a stationary base 156 and a slider 13 distanced by about 30 mm from each other. The sample 14 of a piece of coaxial shielded wire or cord is connected at its one end 11 to a recorder 16 through an amplifier 17.

The slider 13 is moved up and down at a frequency of 240 cycle/min with a stroke of about 80 mm so as to make the sample 14 to perform reciprocating bending movement. A voltage generated in the sample 14 is recorded in the recorder 16 after being amplified in the amplifier 17 to thereby measure the resultant electrostatic noises.

Devices used for the experiment were as follows:
Amplifier: HP-601 High-Gain Differential Preamplifier produced by IWATSU ELECTRIC Co., Ltd.
Pen recorder: LR-43 Noise Vibration Recorder (Chart speed: 5 mm/sec) produced by Rion Company Ltd.

(3) RESULTS OF EXPERIMENT

As shown in FIG. 3, when the sample was made to perform reciprocating movement at a frequency of 240 cycle/min, the generated electrostatic voltage was too weak to be measured in the case of the Sample A (according to the present invention), while the generated electrostatic voltage was 2.5 mV in the case of the Sample B (according to the prior art).

As a result, the coaxial shielded wire or cord, according to the present invention, is advantageous in the following points:

(1) Compared with the conventional coaxial shielded wire or cord, the coaxial shielded wire or cord according to the present invention improves the preventing of electrostatic noises from occurring without substantially increasing the outer diameter of the coaxial shielded wire or cord.

(2) The coaxial shielded wire or cord, according to the present invention, is optimum for use for wiring in a portion where various devices are mounted at high density within electronic equipment because the coaxial shielded wire or cord is substantially unaffected by noises, independently of the length of the portion of terminal treatment of the coaxial shielded wire or cord.

Consequently, the coaxial shielded wires or cords or multi-core cables, according to the present invention, are effective in preventing generation of noises due to the movement thereof.

While the applicant has described the invention in connection with what the applicant considers to be the most practical preferred embodiments, the applicant does not limit the invention to the disclosed embodiment but, on the contrary intends the invention to cover various modifications and equivalent arrangements included within the spirit and scope of the appended claims.

What is claimed is:

1. A coaxial cable comprising:
   an electrical conductor;
   an insulator enclosing the conductor;
   a metal-coated plastic layer enclosing the insulator, the layer having an interior surface made of a non-metallic layer integrated with the insulator, and having an exterior surface made of a metallic layer not less than 0.2 $\mu$m thick;
   a metal shield enclosing the metal-coated plastic layer and contacting the exterior surface of the metal-coated plastic layer.

2. A coaxial cable comprising:
   an electrical conductor;
   an insulator enclosing said conductor;
   a plastic tape having an exterior surface coated with a metal layer, said plastic tape being wound around and integrated with said insulator; and
   a metal shield enclosing said plastic tape so that said metal layer of said plastic tape comes into contact with said metal shield, said metal shield comprising a spiral covering about said plastic tape.

3. A coaxial cable according to claim 2, wherein:
   the metal layer is an evaporation coated metal layer not less than 0.2 $\mu$m thick.

4. A coaxial cable according to claim 2, wherein:
   the metal layer is a sputtering coated metal layer not less than 0.2 $\mu$m thick.

5. A multi-core cable comprising:
   a plurality of coaxial shielded cables each including an electrical conductor; and
   a plurality of insulators enclosing said conductors in a one-to-one correspondence, a plurality of plastic tapes having exterior surfaces coated with metal layers not less than 0.2 $\mu$m thick and being wound around and integrated with said insulators in a one-to-one correspondence; and
   a plurality of metal shields enclosing said plastic tapes on a one-to-one correspondence so that said metal layers of said plastic tapes come into contact with said corresponding metal shields.

6. A multicore cable according to claim 5, wherein:
   the metal layer is an evaporation coated metal layer not less than 0.2 $\mu$m thick.

7. A multicore cable according to claim 5, wherein:
   the metal layer is a sputtering coated metal layer not less than -.2 $\mu$m thick.

* * * * *